United States Patent [19]

Babich et al.

[11] Patent Number: 4,981,909
[45] Date of Patent: Jan. 1, 1991

[54] PLASMA-RESISTANT POLYMERIC MATERIAL, PREPARATION THEREOF, AND USE THEREOF

[75] Inventors: Edward D. Babich, Ridgefield, Conn.; Michael Hatzakis, Chappaqua, N.Y.; Scott L. Jacobs, Fishkill, N.Y.; Juri R. Parasczcak, Pleasantville, N.Y.; Jane M. Shaw, Ridgefield, Conn.; David F. Witman, Ossining, N.Y.

[73] Assignee: International Business Machines Corporation, Armonk, N.Y.

[21] Appl. No.: 241,281

[22] Filed: Sep. 7, 1988

Related U.S. Application Data

[62] Division of Ser. No. 713,509, Mar. 19, 1985, Pat. No. 4,782,008.

[51] Int. Cl.$^5$ ............... G03C 8/42; B05D 3/04; C08F 8/42
[52] U.S. Cl. ............ 525/102; 525/512; 525/398; 525/61; 525/100; 525/103; 525/506; 525/480; 522/28; 430/175; 430/176; 430/270; 427/340
[58] Field of Search ............ 525/61, 100, 102, 103, 525/506, 480, 512, 398; 430/175, 176, 270; 427/340; 522/28

[56] References Cited

U.S. PATENT DOCUMENTS

| | | | |
|---|---|---|---|
| 3,652,274 | 3/1972 | Verelst et al. | 96/36.3 |
| 4,007,047 | 2/1977 | Kaplan et al. | 96/36 |
| 4,125,650 | 11/1978 | Chiu et al. | 427/337 |
| 4,289,473 | 9/1981 | Economy et al. | 156/643 |
| 4,307,178 | 12/1981 | Kaplan et al. | 156/643 |
| 4,373,043 | 2/1983 | Yagi et al. | 524/165 |
| 4,426,247 | 1/1984 | Tamamura et al. | 156/643 |
| 4,430,153 | 2/1984 | Gleason et al. | 156/643 |
| 4,456,679 | 6/1984 | Leyrer et al. | 430/280 X |
| 4,489,200 | 12/1984 | Dziark | 528/18 |
| 4,492,855 | 1/1985 | Sachdev et al. | 430/314 X |
| 4,502,916 | 3/1985 | Umezaki et al. | 156/643 |
| 4,507,331 | 3/1985 | Hiraoka | 156/643 X |
| 4,521,274 | 6/1985 | Reichmanis et al. | 156/643 |
| 4,551,418 | 11/1985 | Hult et al. | 430/325 |
| 4,552,833 | 11/1985 | Ito et al. | 430/325 |
| 4,565,771 | 1/1986 | Lynch et al. | 430/280 X |

Primary Examiner—Cynthia Hamilton
Attorney, Agent, or Firm—Pollock, Vande, Sande & Priddy

[57] ABSTRACT

Plasma-resistant polymeric materials are prepared by reacting a polymeric material containing reactive hydrogen functional groups with a multifunctional organometallic material containing at least two functional groups which are reactive with the reactive hydrogen functional groups of the polymeric material, such as hexamethylcyclotrisilazane.

19 Claims, No Drawings

PLASMA-RESISTANT POLYMERIC MATERIAL, PREPARATION THEREOF, AND USE THEREOF

This is a divisional of Ser. No. 713,509, U.S. Pat. No. 4,782,008 filed on Mar. 19, 1985.

TECHNICAL FIELD

The present invention is concerned with polymeric materials which are resistant to oxygen-containing plasma. The present invention is also concerned with a process for obtaining plasma-resistant polymeric materials, as well as their use in lithography. For instance, the materials of the present invention are suitable for use in device fabrication on all optical, e-beam, X-ray, and ion-beam lithography tools and for packaging applications, such as multi-layer ceramic packaging devices.

BACKGROUND ART

In the manufacture of patterned devices, such as semiconductor chips and chip carriers, the processes of etching different layers which constitute the finished product are among the most crucial steps involved. One method widely employed in the etching process is to overlay the surface to be etched with a suitable mask and then to immerse the substrate and mask in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the selectivity of direction (anisotropy) considered necessary to achieve optimum dimensional consistent with current processing requirements.

Moreover, such wet etching processes are undesirable because of the environmental and safety concerns associated therewith.

Accordingly, various so-called "dry processes" have been suggested to improve the process from an environmental viewpoint, as well as to reduce the relative cost of the etching. Furthermore, these "dry processes" have the potential advantage of greater process control and higher aspect ratio images.

Such "dry processes" generally involve passing a gas through a container and creating a plasma in this gas. The species in this gas are then u: ed to etch a substrate placed in the chamber or container. Typical examples of such "dry processes" are plasma etching, sputter etching, and reactive ion etching.

Reactive ion etching provides well-defined, vertically etched, sidewalls. A particular reactive ion etching process is disclosed, for example, in U.S. Pat. No. 4,283,249 to Ephrath, disclosure of which is incorporated herein by reference.

Examples of some dry-developable resists are provided in U.S. Pat. Nos. 4,426,247 to Tamamura, et al.; 4,433,044 to Meyer, et al.; 4,357,369 to Kilichowski, et al.; 4,430,153 to Gleason, et al.; 4,307,178 to Kaplan, et al.; 4,389,482 to Bargon, et al.; and 4,396,704 to Taylor. In addition, German patent application No. OS32 15082 (English language counterpart British patent application No. 2097143) suggests a process for obtaining negative tone plasma resist images. Such is concerned with a process involving entrapment of a silicon-containing monomer into a host film at the time of exposure to radiation and requires a processing step to expel the unincorporated silicon monomer from the film before plasma developing of the relief image.

A more recent example of a plasma developable resist is described in U.S. patent application Ser. No. 609,690 (assigned to the assignee of the present application) in which a method is provided for obtaining a resist which is stated to be radiation sensitive and oxygen plasma developable. Such process involves coating a substrate with a film of a polymer that contains a masked reactive functionality; imagewise exposing the film to radiation under conditions that cause unmasking of the reactive functionality in the exposed regions of the film; treating the exposed film with a reactive organometallic reagent; and then developing the relief image by treatment with an oxygen plasma. The specific organometallic reagents described therein are trimethylstannyl chloride, hexamethyldisilazane, and trimethylsilyl chloride. All of these materials are monofunctional.

In addition, a method of obtaining a two-layer resist by top imaging a single layer resist is described in U.S. patent application Ser. No. 679,527 (FI9-84046, assigned to the assignee of the present application) which also employs a monofunctional organometallic reagent.

The disclosures of the above two U.S patent applications are incorporated herein by reference.

SUMMARY OF INVENTION

According to the present invention, a process is provided which comprises providing a layer of polymeric material wherein the polymeric material contains reactive hydrogen functional groups, or reactive hydrogen functional precursor groups, or both. At least a portion of the layer of polymeric material is reacted with a multifunctional organometallic material. The organometallic material contains at least two functional groups which are reacted with the above-defined reactive groups of the polymeric material. The reaction is such as to render the reacted portion of the layer resistant to oxygen plasma. After the reacted portion of the layer is rendered resistant to oxygen plasma, the layer is subjected to a gas plasma atmosphere The reacted portion is at least 20 times more resistant to oxygen plasma than the corresponding unreacted polymeric material.

In addition, the present invention is concerned with an improved method for rendering a polymeric material resistant to oxygen plasma. This process of the present invention includes providing a polymeric material which contains reactive hydrogen functional groups, or reactive hydrogen functional precursor groups, or both. In addition, a liquid composition is provided which contains a multifunctional organometallic material, a solvent for the multifunctional organometallic material, and a solvent for the polymeric material. The multifunctional organometallic material contains at least two functional groups which are reactive with the above-defined reactive groups of the polymeric material The solvent for the multifunctional organometallic material is nonreactive with the organometallic material Likewise, the solvent for the polymeric material is nonreactive with the multifunctional organometallic material. The solvent for the polymeric material is provided in an amount which is effective to decrease the reaction time between the multifunctional organometallic material and the polymeric material. The liquid composition and the polymeric material are contacted to thereby render the polymeric material resistant to oxygen plasma.

The present invention is also concerned with a process which comprises providing a layer of polymeric material on a substrate wherein said polymeric material contains at least reactive hydrogen function groups or reactive hydrogen functional precursor groups reacting at least through 25% of the depth of said layer of polymeric material with a multifunctional organometallic material containing at least two functional groups which are reactive with the reactive groups of said polymeric material.

In addition, the present invention is concerned with cross-linked polymeric materials which are the reaction product of cyclic organometallic compounds having 4, 5 or 6 atoms in the ring such as hexamethylcyclotrisilazane and a polymeric material containing reactive hydrogen functional groups, or reactive hydrogen functional precursor groups, or both.

BEST AND VARIOUS MODES FOR CARRYING OUT INVENTION

The polymeric materials employed in the present invention include a number of different types of materials provided such contain reactive hydrogen functional groups and/or groups which act as precursors to reactive hydrogen functional groups. For instance, the polymeric material can contain moieties which are labile such that upon subjection to certain conditions, such as irradiation, will produce reactive hydrogen functional groups. As used herein, "hydrogen functional groups" includes normal hydrogen function groups, as well as its isomer; deuterium functional groups with normal hydrogen being preferred.

Examples of polymers having reactive hydrogen functional groups include prepolymerized phenol-formaldehyde polymers which can be prepared by the acid or base catalyzed condensation of formaldehyde with an excess of a phenol having the formula:

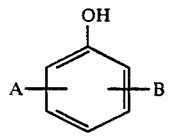

wherein A and B, individually, are hydrogen or alkyl group containing 1-6 carbon atoms. Such phenolic-formaldehyde polymers are referred to as novolak polymers In addition, such phenol-novolak compositions can contain a diazo ketone sensitizer as known in the art. Such sensitizers and polymers are described, for example, in U.S. Pat. Nos. 3,046,118; 3,046,121; 3,106,465; 3,201,239; and 3,666,473; disclosures of which are incorporated herein by reference. The sensitizers are diazo ketones having diazo and keto group at adjacent positions on the molecules, such as the naphthoquinone-(1,2)-diazide sulfonic acid esters which are reported in U.S. Pat. No. 3,201,239 which has the formula:

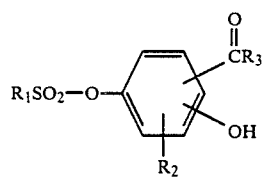

in which $R_1$ is a naphthoquinone-(1,2)-diazide radical, $R_2$ is selected from the group of hydrogen and hydroxyl, and $R_3$ is from the group of hydrogen, alkyl, aryl, alkoxy, aryloxy, amino, and heterocyclic groups.

Examples of sensitizers are also reported in U.S. Pat. No. 3,046,118 which has the formula:

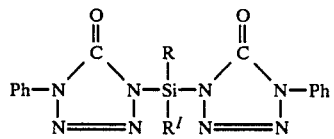

wherein X and $X_1$ are $N_2$ or O, those attached to the same ring being different, and Y is an organic linkage containing at least one arylene, substituted arylene, or heterocyclic radical; U.S. Pat. No. 3,046,121 which has the formula:

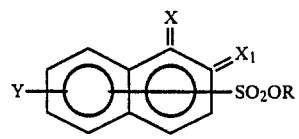

wherein X and $X_1$ are from the group of $N_2$ and O and are different. Y is hydrogen or halogen and R is a substituted or unsubstituted aryl or heterocyclic radical; and U.S. Pat. No. 3,106,465 which has one of the formula:

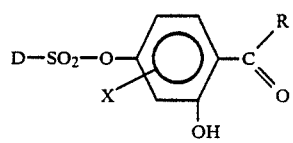

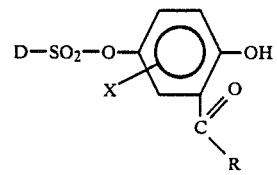

wherein D stands for naphthoquinone-(1,2)-diazide radical; X stands for H or OH; R stands for a member of the group of hydrogen, $OR_1$, $NR_2R_3$, alkyl-, aryl-, and heterocyclic radicals; $R_1$ is an alkyl or aryl; $R_2$ and $R_3$ are a hydrogen alkyl or aryl, $R_2$ equaling $R_3$ or being different from $R_3$.

Examples of such compounds are 2,3,4-trihydroxybenzophenone esters of 1-oxo-2-naphthalene-5 sulfonic acid. The sensitizers, when used, are generally employed in amounts of about 12% to about 30% by weight of the polymeric components of the composition.

Examples of reactive hydrogen functional groups include OH, COOH, NH, and SH groups. Also, epoxide groups which are capable of undergoing ring opening and forming OH groups are suitable reactive hydrogen functional precursor groups.

Examples of other polymers include polyvinylpyrrolidone, polyvinylalcohol, polymers of p-hydroxystyrene, melamino polymers, homopolymers and copolymers of monoethylenically unsaturated acids, copolymers of alkyl methacrylates containing about 1-4 carbon atoms in the alkyl group, and a monoethylenically unsaturated acid. The monoethylenically unsaturated acid can be acrylic acid, methacrylic acid, or crotonic acid Usually the polymer contains from about 50 to about 99.5 mole percent of the alkyl methacrylate and about 50 to about 0.5 mole percent of the unsaturated acid. These mole percents are based upon the total moles of the alkyl methacrylate and acid in the polymer Examples of such polymers can be found in U.S. Pat. No. 3,984,582, disclosure of which is incorporated herein by reference.

Polymers containing labile groups which are capable upon excitation, such as upon irradiation of generating reactive hydrogen groups include O-nitrobenzene derivatives and polymers capable of photo-fries rearrangement. Upon irradiation, acids, alcohols, and/or amines with reactive hydrogens are generated. Examples of such materials are:

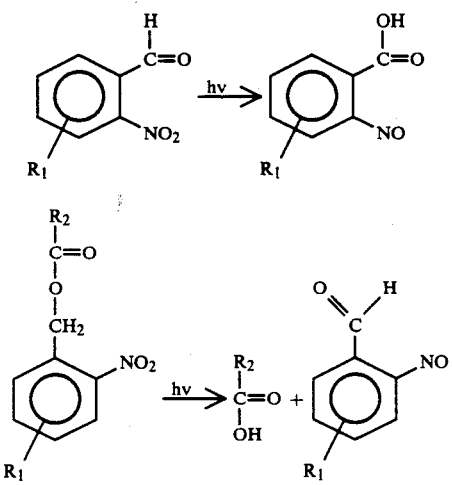

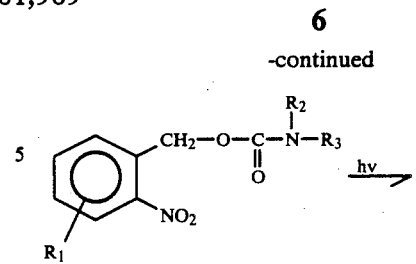

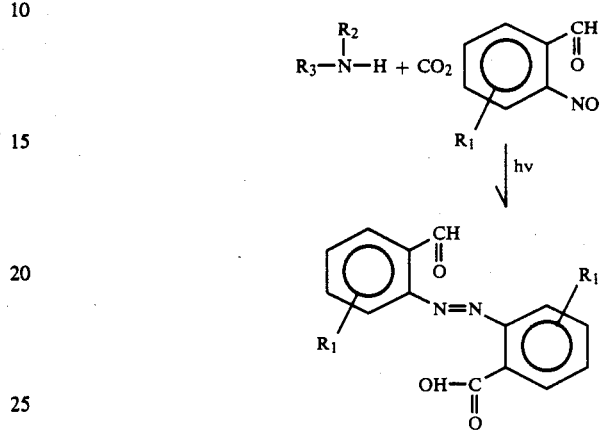

wherein $R_1$, $R_2$, $R_3$, and $R_5$=H, alkyl, aryl, or part of a polymer backbone and $R_4$=H, $C_nH_{2n+1}$ wherein n ranges from 1 to about 5 phenyl or substituted phenyls.

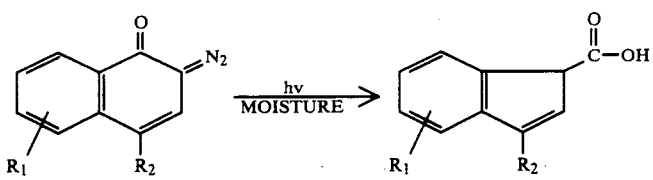

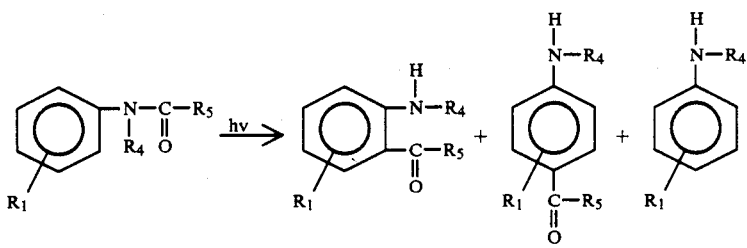

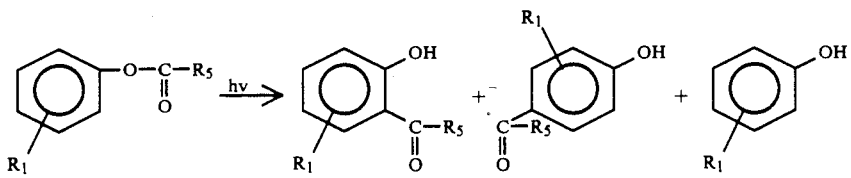

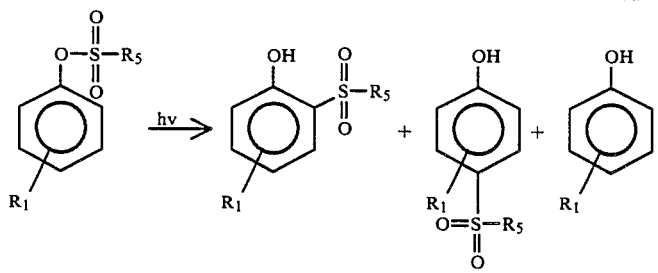

wherein $R_1$, $R_2$, $R_3$, and $R_5 =$ H, alkyl, aryl, or part of a polymer backbone and $R_4$- H, $C_nH_{2n+1}$ ranges from 1 to about 5, phenyl or substituted phenyls.

Materials of the above type can be used alone or in combination with compatible polymeric materials. Compounds such as substituted O-nitrobenzaldehyde, esterified phenols, and diazoquinone derivatives can be mixed together with polymers which have no labile or reactive hydrogens. For example, polymethylmethacrylate, styrene-butadine rubbers, polymethylisopropenyl ketone (PMIPK), and polystyrene and its derivatives. Upon irradiation, the molecules which are sensitive to the irradiation undergo rearrangement to yield products with labile and reactive hydrogens. The labile and reactive hydrogens are then subsequently reacted with an organometallic reagent pursuant to the process of the present invention.

Examples of such particular polymers include acetylated polyvinylphenol, poly (p-formyl) oxystyrene, copolymers prepared from p-formyl oxystyrene, poly (t-butyl) methacrylate, poly (t-butyloxycarbonyloxystyrene), and copolymers from t-butylmethacrylate or t-butyloxycarbonyloxystyrene. Disclosures of such polymers can be found in U.S. patent application Ser. Nos. 679,527, 609,690, and now Ser. No. 713,370 to Hefferon, et al. filed concurrently herewith and entitled "Method of Creating Patterned Multilayer Films for Use in Production of Semiconductor Circuits and Systems" disclosures of which are incorporated herein by reference.

The multifunctional organometallic material employed pursuant to the present invention must contain or be capable of supplying at least two functional groups which are reactive with the reactive groups of the polymeric material Examples of suitable metallic portions of the organometallic material are Group III A metals, Group IV A metals, Group IV B metals, and Group VI B metals. Examples of Group IV A metals are tin, germanium, and silicon Examples of Group IV B metals are titanium and zirconium. Examples of Group VI B metals are tungsten and molybdenum. An example of a Group III A metal is aluminum. The preferred metallic portions are titanium, silicon, and tin, with the most preferred being silicon.

The reactive groups of the organometallic compound include such reactive groups as hydroxy, amino, mercapto, and halogen; and groups capable of supplying reactive groups include alkoxy groups, such as methoxy and ethoxy which hydrolyze to form OH groups.

Examples of suitable organometallic compounds include the following:

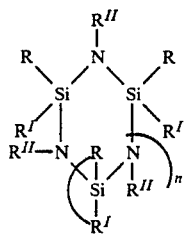

1.

wherein each R and $R^I$, individually, is H, alkyl, cycloalkyl, aryl, halo-substituted alkyl, halo, or halo-substituted aryl; each $R^{II}$, individually, is H, alkyl, or aryl, and n is a whole number integer $\geq 1$ and preferably 1 or 2.

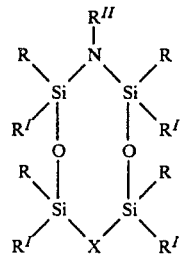

2.

wherein each R and $R^I$, individually, is H, alkyl, cycloalkyl, aryl, halo, halo-substituted alkyl, or halo-substituted aryl; each $R^{II}$, individually is H, alkyl or aryl; and X is O, Si, or N-R".

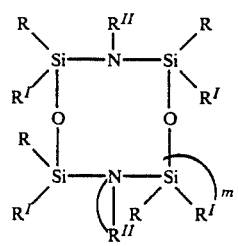

3.

wherein each R and $R^I$, individually, is H, alkyl, cycloalkyl, aryl, halo, halo-substituted alkyl, or halo-substituted aryl; each $R^{II}$, individually, is H, alkyl, or aryl; d m is a whole number integer 1 and preferably 1 or 2.

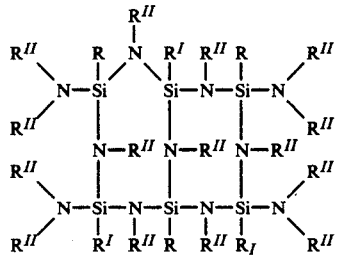

4.

wherein each R and $R^I$, individually, is H, alkyl, hycalkyl, aryl, halo, halo-substituted alkyl, or halo substituted aryl; and each $R^{II}$, individually, is U, alkyl, of aryl.

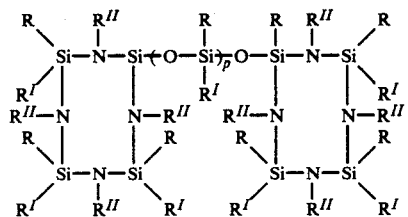

5.

wherein each R and $R^I$, individually, is H, alkyl, cycloalkyl, aryl, halo, halo-substituted alkyl, or halo-substituted aryl; each $R^{II}$, individually, is H, alkyl, or aryl; and p is a whole number integer of $\geq 1$ and preferably 1–4.

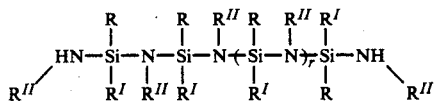

6.

wherein each R and $R^I$, individually, is H, alkyl, cycloalkyl, aryl, halo, halo-substituted alkyl, or halo-substituted aryl; each $R^{II}$, individually, is H, alkyl, or aryl; and r is a whole number integer of $0$–$10^2$, preferably 1–4.

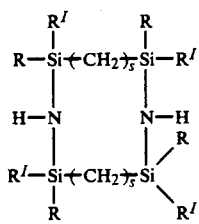

7.

wherein each R and $R^I$, individually, is H, alkyl, cycloalkyl, aryl, halo, halo-substituted alkyl, or halo-substituted aryl; and each s, individually, is a whole number integer $\geq 1$, and preferably 1 or 2.

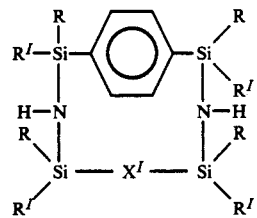

8.

wherein each R and $R^I$, individually, is H, alkyl, cycloalkyl, aryl, halo-substituted alkyl, halo-substituted aryl, or halo; and $X^I$ is $(-CH_2-)_t$, or

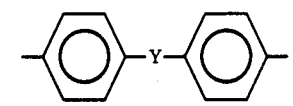

wherein t is a whole number integer of $\geq 1$ and preferably 1–4; and Y is O, NH, or S.

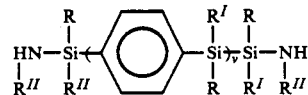

9.

wherein each R and $R^I$, individually, is H, alkyl, cycloalkyl, aryl, halo, halo-substituted alkyl, or halo-substituted aryl; and v is a whole number integer of $\geq 1$ and preferably 1–4.

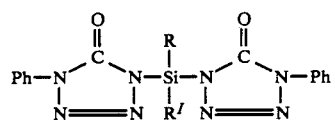

10.

wherein each R and $R^I$, individually, is H, alkyl, cycloalkyl, aryl, halo, halo-substituted alkyl, or halo-substituted aryl.

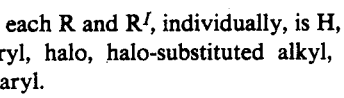

11.

wherein each R and $R^I$, individually, is H, alkyl, cycloalkyl1, aryl, halo, halo-substituted alkyl, or halo-substituted aryl, and each $R^{III}$, individually, is alkyl.

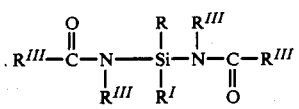

12.

wherein each R and $R^I$, individually, is H, alkyl, cycloalkyl, aryl, halo, halo-substituted alkyl, or halo-substituted aryl; each $R^{II}$, individually, is H, alkyl, or aryl; and w is a whole number integer $\geq 1$ and preferably 1–4.

13.

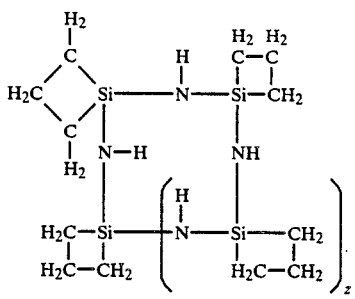

wherein z is a whole number integer of 0–4 and preferably 0–2.

14.

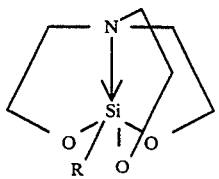

wherein R is H, alkyl, cycloalkyl, aryl, halo, halo-substituted alkyl, or halo-substituted aryl.

15.

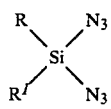

wherein each R and $R^I$, individually, is H, alkyl, cycloalkyl, aryl, halo, halo-substituted alkyl, or halo-substituted aryl.

16.

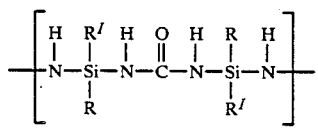

wherein each R and $R^I$ is H, alkyl, aryl, cycloalkyl, halo, halo-substituted alkyl, or halo-substituted aryl; and a is a whole number integer $\geq 1$ and preferably 1–4.

17.

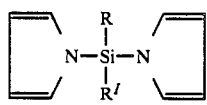

wherein R and $R^I$, individually, is H, alkyl, cycloalkyl, aryl, halo, halo-substituted alkyl, or halo-substituted aryl.

18.

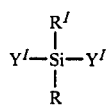

wherein each $Y^I$, individually, is

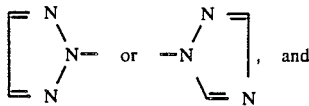

$R^I$ and R, individually, is H, alkyl, aryl, cycloalkyl, halo, halo-subsilted alkyl, or halo substituted aryl.

19.

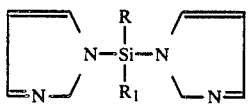

wherein R and $R^I$, individually, is H, alkyl, cycloalkyl, aryl, halo, halo-substituted alkyl, or halo-substituted aryl.

20.

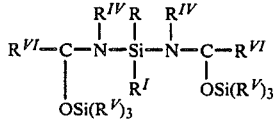

wherein R and $R^I$, individually, is H, alkyl, aryl, cycloalkyl, halo, halo-substituted akyl, or halo-substituted aryl; each $R^{IV}$, individually, is H or alkyl; each $R^V$, individually, is H or alkyl; and each $R^{VI}$, individually, is alkyl or $CX_3$(X=F, Cl, Br, I).

21.

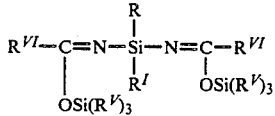

wherein R and $R^I$, individually, is H, alkyl, aryl, cycloalkyll, halo, halo-substituted akyl, or halo-substituted aryl; each $R^{IV}$, each $R^V$, individually, is H or alkyl; and each $R^{VI}$, individually, is alkyl or $CX_3$(X=F,Cl, Br, I).

22.

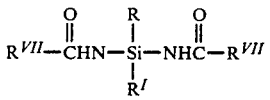

wherein R and $R^I$, individually, is H, alkyl, aryl, cycloalkyll, halo, halo-substituted akyl, or halo-substituted aryl; and each $R^{VII}$, individually, is alkyl.

23.

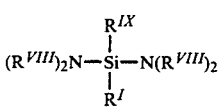

wherein each $R^{IX}$, individually, is alkyl; and each $R^{VIII}$, individually, is alkyl.

24.

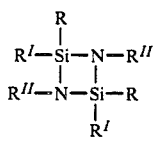

wherein each R and $R^I$, individually, is H, alkyl, cycloalkyl, aryl, halo-substituted alkyl, halo or halo-substituted aryl; each $R^{II}$, individually, is H, alkyl or aryl.

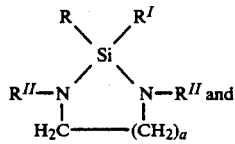

25.

dimers and polymers thereof wherein each R and $R^I$, individually, is H, alkyl, cycloalkyl, aryl, halo-substituted alkyl, halo, or halo-substituted aryl; each $R^{II}$, individually, is H, alkyl or aryl; and a is 1, 2, or 3.

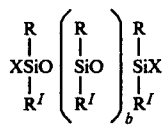

26.

wherein b is a whole number integer of 1-5; each R and $R^I$, individually, is H, alkyl, cycloalkyl, aryl, halo-substituted alkyl, halo, or halo-substituted aryl; each X, individually, is halo, SH, OH, $OR^x$, and NH and $R^x$ is alkyl, 1-5 carbon atoms, and preferably ethyl or methyl.

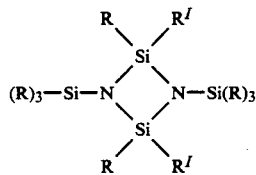

27.

wherein each R and $R^I$, individually, is H, alkyl, cycloalkyl, aryl, halo-substituted alkyl, halo, or halo-substituted aryl.

Examples of suitable alkyl groups in the above formulas are groups containing 1-12 carbon atoms and preferably 1-4 carbon atoms. Specific examples of such are methyl, ethyl, propyl, butyl, and octyl. The most preferred alky groups are methyl and ethyl.

Examples of suitable cycloalkyl groups are cyclohexyl and cycloheptyl.

Examples of suitable aryl groups are phenyl, tolyl, xylyl, and napthyl radicals.

Examples of suitable halo radicals are F, Cl, Br, and I.

Examples of suitable halo-substituted alkyl groups are 1,1,1-trifluoropropyl, and chloromethyl.

Examples of suitable halo-substituted aryl groups are chlorophenyl and dibromophenyl.

In many applications of the use of the products of the present invention, it is preferred that the organometallic compound not include any halogen component such as chlorine to assure against the possibility of causing corrosion due to the potential formation of some corrosive halide gas.

The preferred organometallic compounds are the cyclic organo silicon compounds and more preferably hexamethylcyclotrisilazane.

The amount of the organometallic material employed must be sufficient to provide the desired degree of cross-linking and plasma resistance. Usually, the relative amount of the organometallic material to the polymeric material provides at least about 1 part by weight of the metallic component (e.g. - Si) per 20 parts of the polymeric material, and up to about 1 part by weight of the metallic component per 2 parts by weight of the polymeric material, and preferably about 1 part by weight of the metallic component per 15 parts of the polymeric material to about 1 part by weight of the metallic component per 4 parts by weight of the polymeric material.

The cross-linked polymeric materials prepared in accordance with the present invention are resistant to oxygen plasma and are extremely stable when exposed to elevated temperatures The cross-linked polymeric materials of the present invention are at least about 20 times, preferably ar least about 50 times, and in many cases, at least about 100 times as resistant to oxygen plasma as is the corresponding noncross-linked polymeric material Cross-linked polymeric materials, such as novlak resins in accordance with the present invention have thermal stabilities of up to about 400° C.; whereas, polymeric materials prepared with monofunctional organometallic materials, such as discussed in U.S. patent application Ser. No. 609,690, do not have thermal stabilities above about 200° C. Moreover, even upon decomposition, the cross-linked materials of the present invention, and particularly the novolak resins, do not form volatile materials at temperatures up to about 400° C. as occur when monofunctional organometallic compounds are employed in the reaction The materials of the present invention exhibit good solvent resistance. Accordingly, materials of the present invention are useful in environments other than those which involve exposure to an oxygen-containing plasma For instance, materials of the present invention can be used in applications which require materials to be resistant to high temperature.

The materials of the present invention can be prepared by reacting the polymeric material with the multifunctional organometallic material in either the vapor phase or preferably dissolved in a suitable solvent. In the preferred aspects of the present invention, the polymeric material is already in the form of a film or layer when contacted with the multifunctional organometallic material.

For instance, the polymeric material, particularly when it is to be employed in a lithographic process, is applied to a desired substrate to provide films generally about 1500 angstroms to about 1 mil thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

Moreover, the polymeric materials can be used as coatings on those substrates employed as chip encapsulants and including ceramic substrates and, especially, multilayer ceramic devices. Also included are dielectric substrates which can be thermoplastic and/or thermosetting polymers. Typical thermosetting polymeric materials include epoxy, phenolic-base materials, polyamides, and polyimides. The dielectric materials can be molded articles of the polymers containing fillers and- /or reinforcing agents, such as glass-filled epoxy or phenolic-base materials. Examples of some phenolic-type materials include copolymers of phenol, resorcinol, and cresol. Examples of some suitable thermoplastic polymeric materials include polyolefins, such as polypropylene, polysulfones, polycarbonates, nitrile rubbers, and ABS polymers.

The reaction between the organometallic material is usually carried out in about 5 minutes to about 1 hour depending upon the relative reactivities of the materials employed, the solvent system employed, and the depth through the film to which it is desired to cause the cross-linking. For instance, it may be desired to only effect the reaction through a portion of the layer of the polymeric material.

In most applications, at least about 25%, and preferably at least 50% of the total thickness of the film is cross-linked. In many instances, the entire thickness, or at least substantially the entire film thickness, is cross-linked Usually the thickness reacted is at least 0.3 microns Generally thicknesses above about 25 microns are not necessary for the applications to which the films are most useful. Preferably thickness is about 0.4 to about 10 microns. Most preferably the thickness is about 0.5 to about 5 microns.

In the preferred aspects of the present invention, the organometallic material is dissolved in an organic solvent which is non-reactive with the organometallic material It is preferred that the inert organic solvent be aprotic The most preferred solvents are the aromatic hydrocarbons and substituted aromatic hydrocarbons including benzene, toluene, xylene, and chlorobenzene. Other solvents include N-methyl pyrrolidone; $\gamma$-butyrolactone; acetates , such as butyl acetate and 2-methoxy acetate; ethers; and tetrahydrofuran. In addition, the solvent is preferably selected so that it has some ability to diffuse enough through the polymeric material to provide the needed contact between the organometallic material and polymeric material It is preferred that this solvent be only a partial rather than a good solvent for the polymeric material. Accordingly, the choice of the polymeric material will have some effect upon the choice of the solvent used for best results In the preferred aspects of the present invention, the solvent component also includes a solvent in which the polymeric material is readily soluble in when the ma3or portion of the solvent component is a non solvent or only a partial solvent for the polymeric material The solvent for the polymeric material is employed in amounts effective to decrease the necessary reaction time between the multifunctional organometallic material and the polymeric material. The solvent for the polymeric material must be non-reactive with the multifunctional organometallic material. Examples of suitable solvents for the polymeric material to be employed are N-methyl pyrrolidone, $\gamma$-butyrolactone, and acetates, such as cellosolve acetate, butyl acetate, and 2-methoxy ethyl acetate.

The solvent for the polymeric material is employed in relatively minor amounts so as not to remove or dissolve the polymeric film. Preferred amounts of the organic solvent for the polymeric material are about 0.01% to about 25% by volume, and more preferably about 0.25% to about 5%, based on the total amount of organic solvent in the liquid composition. The total amount of solvent in the liquid composition is usually about 75% to about 98% and preferably about 95% to about 96% based upon the total of the solvent and organometallic material in the liquid composition Use the polymeric material.

An example of a process employing the materials of the present invention involves coating a thin layer of about 0.4 to about 10 microns of a photoresist material over a polymeric surface as the substrate. Examples of suitable photoresist materials include the above-described phenolic-formaldehyde photoresist containing quinone sensitizers.

Such materials are preferably subjected to elevated temperatures of about 80° C. for about 15 minutes to effect a precuring or prebake of the composition.

The resist is then exposed to ultraviolet light and developed in an alkaline solution to removed those portions of the resist which were exposed to the ultraviolet light.

Next, the developed patterned images are contacted with the organometallic materials, such as by flooding the substrate on a spinner in a solution of the organometallic material solution for about 1 minute to about 60 minutes.

The composite is then washed in a solvent, such as xylene, and baked at about 125° C. for about 1 hour.

Next, the composite is placed in a reaction chamber which is then evacuated and filled with oxygen. The pressure in the reaction chamber is about 10 millitorr and the gas is introduced into the reaction chamber at a flow rate of about 0.02 standard liters per minute A plasma is formed in the oxygen gas by coupling radio frequency power of about 0.02 kilowatts to the plasma and is continued for about 10–250 minutes. The oxygen-containing plasma can be from oxygen, oxygen-inert gas mixtures (e.g. - argon), oxygen-halocarbon mixtures (e.g. - $CF_4$), and oxygen-hydrocarbon, as is well-known.

The portion of the organic polymeric substrate which is protected by the reaction product resists the oxygen plasma and remains intact. That portion of the organic polymeric substrate not protected by the reaction product is etched by the oxygen plasma.

The following non-limiting examples are presented to further illustrate the present invention.

EXAMPLE 1

A layer of about 1 micron thick of Shipley AZ-1350 positive photoresist, which is an m-cresol formaldehyde novolak polymer containing about 15% by weight of 2-diazo-1-naphthoquinone-5-sulphonic acid ester, is coated onto a substrate of a polyimide of about 2 microns thick.

The photoresist is prebaked at about 80° C. for about 15 minutes.

The resist is then imagewise exposed to ultraviolet light and developed in an alkaline solution to remove those portions of the resist which were exposed to the ultraviolet light.

Next, the developed patterned image is reacted with hexamethylcyclotrisilazane by flooding the substrate on a spinner in a solution of 30% hexamethylcyclotrisilazane in chlorobenzene for about 10 minutes at room temperature The composite is then washed in xylene and baked at about 80° C. for about 1 hour Next, the composite is placed in a reaction chamber which is then evacuated and filled with oxygen. The pressure in the reaction chamber is about 10 millitorr and the gas is introduced into the reaction chamber at a flow rate of about 0.02 standard liters per minute The oxygen is disassociated by coupling radio frequency power of about 0.02 kilowatts to the plasma and is continued for about 15 minutes.

The portion of the substrate which is protected by the reaction product resists the oxygen plasma and remains intact. That portion of the substrate not protected by the reaction product is etched by the oxygen plasma.

EXAMPLE 2

Example 1 is repeated, except that the organometallic composition is a 10% solution of hexamethylcyclotrisilazane in xylene. The reaction of the hexamethylcyclotrisilazane with the polymeric material is carried out at about 40° C. for about 30 minutes.

EXAMPLE 3

Example 2 is repeated, except that the organometallic composition is a 10% solution of hexamethylcyclotrisilazane in xylene containing 1% by weight of N-methylpyrrolidone. The reaction time is reduced to only 10 minutes.

EXAMPLE 4

Example 2 is repeated, except that the organometallic composition is a 10% solution of hexamethylcyclotrisilazane in xylene containing 1% of Y-butyrolactone. The reaction time between the silazane and polymeric material is reduced to 10 minutes.

A comparison of Examples 3 and 4 with Example 2 illustrates the improved results obtained by incorporating small amounts of a solvent for the polymeric material.

EXAMPLE 5

Example 2 is repeated, except that the polymeric material is Kodak 820 positive resist The reaction is carried out at about 75° C. in about 45 minutes.

EXAMPLE 6

Example 2 is repeated, except that the organometallic composition is a 10% solution of hexamethylcyclotrisilazane in xylene containing 5% by weight of N-methylpyrrolidone and the polymeric material is Kodak 820 positive resist. The reaction is carried out at about 40° C. in about 10 minutes

EXAMPLE 7

Example 2 is repeated, except that the organometallic composition is a 10% solution of hexamethylcyclotrisilazane in γ-butyrolactone and the polymeric material is a terpolymer of methylmethacrylate, methacrylic acid, and methacrylic anhydride. The reaction is carried out at about 40° C. in about 10 minutes.

EXAMPLE 8

Example 2 is repeated, except that the organometallic composition is a 10% solution of octamethylcyclotetrasilizane in xylene. The reaction is carried out at about 40° C. for about 10 minutes

EXAMPLE 9

Example 2 is repeated, except that the organometallic composition is a 10% solution of 1,3 dichlorodimethydiphenyl disilazane in xylene. The reaction is carried out at about 40° C. for about 10 minutes.

EXAMPLE 10

Example 2 is repeated, except that the organometallic composition is a 10% solution of 1,7 dichlorooctamethyl tetrasilizane in xylene. The reaction is carried out at about 40° C. for about 10 minutes.

EXAMPLE 11

Example 2 is repeated, except that the organometallic composition is a 10% solution of N-methylaminopropyl trimethyoxysilane in xylene The reaction is carried out at about 40° C. for about 10 minutes.

EXAMPLE 12

Example 2 is repeated, except that the organometallic composition is a 10% solution of 3-aminopropylmethyl diethoxy silane in xylene. The reaction is carried out at about 40° C. for about 10 minutes.

EXAMPLE 13

Example 2 is repeated, except that the organometallic composition is a 10% solution of 1,3 divinyltetraethoxy disiloxane in xylene. The reaction is carried out at about 40° C. for about 10 minutes.

EXAMPLE 14

Example 2 is repeated, except that the organometallic composition is a 10% solution of N-2 aminoethyl-3-aminopropyl trimethoxysilane in xylene. The reaction is carried out at about 40° C. for about 10 minutes

EXAMPLE 15

Example 2 is repeated, except that the organometallic composition is a 10% solution of 1,3 bis (gamma-aminopropyl.); tetramethyl disiloxane in xylene. The reaction is carried out at about 40° C. for about 10 minutes.

EXAMPLE 16

Example 2 is repeated, except that the organometallic composition is a 10% solution of tetraethyoxytitanium in xylene. The reaction is carried out at about room temperature for about 60 seconds.

EXAMPLE 17

Example 16 is repeated, except that the organometallic composition is tetraethyoxytitanium. The reaction is carried out at about room temperature for about 30 seconds.

EXAMPLE 18

Example 2 is repeated, except that the organometallic composition is a 10% solution of tetrabutoxytitanium in xylene. The reaction is carried out at about room temperature for about 60 seconds.

EXAMPLE 19

Example 18 is repeated, except that the organometallic composition is tetrabutoxytitanium. The reaction is carried out at about room temperature for about 30 seconds.

Having thus described our invention, what we claim as new and desire to secure by Letters Patent is:

1. A process which comprises providing a layer of polymeric material on a substrate wherein said polymeric material contains at least reactive hydrogen functional groups or reactive hydrogen functional precursor groups, when aid polymeric material contains reactive hydrogen function precursor groups converting said precursor groups to reactive hydrogen groups reacting at least through 25% of the depth of said layer of polymeric material with a multifunctional organometallic material containing at least two functional groups which are reactive with the hydrogen reactive groups of said polymeric material.

2. The process of claim 1 wherein at least 50% of the thickness of said layer is reacted.

3. The process of claim 1 wherein the entire thickness of said layer is reacted.

4. The process of claim 1 wherein said thickness is at least about 0.3 microns.

5. The process of claim 1 wherein said thickness is about 0.3 to 25 microns.

6. The process of claim 1 wherein said thickness is about 0.5 to about 5 microns.

7. The process of claim 1 wherein said layer is prebaked prior to reacting.

8. The process of claim 1 wherein said polymeric material is a prepolymerized phenolic-formaldehyde polymer containing a diazo ketone sensitizer.

9. The process of claim 1 wherein said organometallic material is represented by the formula:

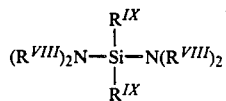

wherein each $R^{IX}$ individually is alkyl and each $R^{VIII}$ individually is alkyl.

10. A cross-linked polymeric material being the reaction product between the functional groups of a cyclic organometallic material having 4, 5 or 6 atoms in the ring which are reactive with reactive hydrogen functional groups and a polymeric material containing reactive hydrogen functional groups, or reactive hydrogen functional precursor groups, or both.

11. The cross-linked polymeric material of claim 10 wherein said polymeric material is a phenolic-formaldehyde polymer.

12. The polymeric material of claim 10 wherein said organometallic material is hexamethylcyclotrisilazane.

13. The cross-linked polymeric material of claim 12 which contains at least about 1 part by weight of silicon per 20 parts of the polymeric material.

14. The cross-linked polymeric material of claim 12 which contains up to about 1 part by weight of silicon per 2 parts by weight of the polymeric material.

15. The polymeric material of claim 12 wherein the ratio of silicon to polymeric material is about 1:15 to about 1:4.

16. The cross-linked polymeric material of claim 10 which is in the form of a layer.

17. The cross-linked polymeric material of claim 10 which is in the form of a layer of about 0.4 to about 10 microns thick.

18. The polymeric material of claim 10 wherein said organometallic material is a cyclic organometallic material.

19. The cross-linked polymeric material of claim 10 wherein said polymeric material is a prepolymerized phenolic formaldehyde polymer containing a diazo ketone sensitizer.

* * * * *

UNITED STATES PATENT AND TRADEMARK OFFICE
CERTIFICATE OF CORRECTION

PATENT NO. : 4,981,909
DATED : January 1, 1991
INVENTOR(S) : Edward Babich, et al.

It is certified that error appears in the above-identified patent and that said Letters Patent is hereby corrected as shown below:

Column 1, line 48, please change "u:ed" to --- used ---.

Column 15, line 47, please change "ma3or" to --- major ---.

Column 17, line 38, after "resist" please insert a --- . ---.

Column 18, line 11, after "xylene" please insert a --- . ---.

Signed and Sealed this

Fourth Day of August, 1992

Attest:

DOUGLAS B. COMER

*Attesting Officer*     Acting Commissioner of Patents and Trademarks